US011769559B2

(12) United States Patent
Wan et al.

(10) Patent No.: US 11,769,559 B2
(45) Date of Patent: Sep. 26, 2023

(54) METHODS OF REDUCING PROGRAM DISTURB BY ARRAY SOURCE COUPLING IN 3D NAND MEMORY DEVICES

(71) Applicant: Yangtze Memory Technologies Co., Ltd., Hubei (CN)

(72) Inventors: Weijun Wan, Hubei (CN); Chunyuan Hou, Hubei (CN)

(73) Assignee: Yangtze Memory Technologies Co., Ltd., Hubei (CN)

(*) Notice: Subject to any disclaimer, the term of this patent is extended or adjusted under 35 U.S.C. 154(b) by 63 days.

(21) Appl. No.: 17/489,206

(22) Filed: Sep. 29, 2021

(65) Prior Publication Data

US 2022/0392550 A1 Dec. 8, 2022

Related U.S. Application Data

(63) Continuation of application No. PCT/CN2021/098557, filed on Jun. 7, 2021.

(51) Int. Cl.
G11C 16/04 (2006.01)
G11C 16/34 (2006.01)
(Continued)

(52) U.S. Cl.
CPC ...... G11C 16/3427 (2013.01); G11C 16/0483 (2013.01); G11C 16/08 (2013.01);
(Continued)

(58) Field of Classification Search
CPC . G11C 16/3427; G11C 16/0483; G11C 16/08; G11C 16/10; G11C 16/24;
(Continued)

(56) References Cited

U.S. PATENT DOCUMENTS 6,639,842 B1 10/2003 Hoang et al.
7,379,335 B2 * 5/2008 Futatsuyama ...... G11C 16/0483
365/185.17
(Continued)

FOREIGN PATENT DOCUMENTS

CN 101727986 A 6/2010
CN 102037516 A 4/2011
(Continued)

OTHER PUBLICATIONS

International Search Report of the International Searching Authority directed to related International Patent Application No. PCT/CN2021/098557, dated Mar. 2, 2022; 6 pages.

*Primary Examiner* — Tha-O H Bui
(74) *Attorney, Agent, or Firm* — Sterne, Kessler, Goldstein & Fox P.L.L.C.

(57) ABSTRACT

The present disclosure provides a three-dimensional NAND memory device, comprising a first NAND string including a first channel corresponding to a first cell to be inhibited to program, and a controller configured to control a word line driver and a bit line driver to do the following operations: prior to applying a program voltage to a selected word line, charging a first bit line electrically coupling with the first channel to a first voltage level for charging the first channel to a first voltage level, charging an array common source electrically coupling with the first bit line for further charging the first channel to a second voltage level higher than the first voltage level, and cutting off the electrical coupling between the first bit line and the first channel for preparing to apply the program voltage to the selected word line.

20 Claims, 10 Drawing Sheets

(51) Int. Cl.
  *G11C 16/08* (2006.01)
  *G11C 16/10* (2006.01)
  *G11C 16/24* (2006.01)
  *G11C 11/56* (2006.01)

(52) U.S. Cl.
  CPC .............. *G11C 16/10* (2013.01); *G11C 16/24* (2013.01); *G11C 11/5628* (2013.01); *G11C 11/5671* (2013.01)

(58) Field of Classification Search
  CPC . G11C 11/5628; G11C 11/5671; G11C 16/32; G11C 16/12
  USPC .................................................... 365/185.02
  See application file for complete search history.

(56) References Cited

U.S. PATENT DOCUMENTS

| | | | |
|---|---|---|---|
| 7,719,902 B2 | 5/2010 | Dong et al. | |
| 8,174,906 B2 | 5/2012 | Kwon et al. | |
| 8,902,659 B2* | 12/2014 | Chan | G11C 7/12 365/185.25 |
| 10,381,096 B2* | 8/2019 | Maejima | G11C 11/5628 |
| 2003/0161182 A1 | 8/2003 | Li et al. | |
| 2012/0069681 A1* | 3/2012 | Oikawa | G11C 16/3418 365/185.24 |

FOREIGN PATENT DOCUMENTS

| | | | |
|---|---|---|---|
| CN | 112634961 A | 4/2021 | |
| CN | 112639978 A | 4/2021 | |

\* cited by examiner

METHODS OF REDUCING PROGRAM DISTURB BY ARRAY SOURCE COUPLING IN 3D NAND MEMORY DEVICES

CROSS-REFERENCE TO RELATED APPLICATIONS

This application claims priority to PCT Application No. PCT/CN2021/098557, filed on Jun. 7, 2021, which is incorporated herein by reference in its entirety.

TECHNICAL FIELD

The present disclosure generally relates to the field of semiconductor technology, and more particularly, to a method for reducing program disturb by array source coupling in three-dimensional (3D) NAND memory devices.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells. In a 3D NAND memory, a memory block can have multiple top select gates (TSGs), while word lines and bottom select gate (BSG) are shared within the block. Each memory cell in the block corresponds to a word line that acts to control the cell. Each memory cell may be associated with a data state according to write data in a program command. Based on its data state, a memory cell will either remain in the erased state or be programmed to a programmed data state. The signal that accesses the cell to either read or write data is applied to the word line and the bit line perpendicular to the word line.

Generally, a read operation in the 3D NAND memory architecture begins with a row address being input to the row decoder. After buffering the address, the row decoder decides which word line to be selected. All of the memory cells connected to that selected word line output a programmable output voltage to their respective bit lines that represent a stored 0 or 1 logic state. The sense amplifiers amplify the change in bit line voltage to a full logic level. The data from the cells, which are on the selected word line, is first buffered and output to the shift register, and then be shifted out from the memory chip to the processor. A write operation also begins with a row address being generated as in a read operation. The new data stored in the processor is shifted out and input to the shift register, and then passed up through the sense amplifier/driver and the column decoder, and finally enter the cells that are on the previously selected word line to replace the old data. However, various challenges, such as program disturb, are presented in program operating in such 3D NAND memory devices.

A know issue called "program disturb" occurs when one or more bits not intended to be programmed are changed during a program operation. An increased number of partial-page programs to a page can exacerbate this error. Program disturb can show up on pages being programmed or on other pages within the same block. As 3D NAND memory is scaled, parasitic capacitance coupling between the selected word line and adjacent word lines becomes problematic. Because of the parasitic coupling, the neighboring cells are more prone to program disturb than the other cells that also share the common bit line with the cells being programmed. This causes the cells on neighboring word lines to experience program disturb.

BRIEF SUMMARY

Embodiments of a three-dimensional (3D) memory device and methods for reducing program disturb by array source coupling in 3D NAND memory devices are described in the present disclosure.

One aspect of the present disclosure provides a three-dimensional (3D) NAND memory device comprising: a first NAND string including a first channel corresponding to a first cell to be inhibited to program; a word line driver; a bit line driver; and a controller configured to control the word line driver and the bit line driver to: (a) prior to applying a program voltage to a selected word line, charge a first bit line electrically coupling with the first channel to a first voltage level for charging the first channel to the first voltage level, (b) charge an array common source electrically coupling with the first bit line for further charging the first channel to a second voltage level higher than the first voltage level, and (c) cut off the electrical coupling between the first bit line and the first channel for preparing to apply the program voltage to the selected word line.

In some embodiments, operation (a) comprises: turning on a top select gate of the first channel and keeping a voltage of the top select gate at a high voltage level; charging the first bit line to the first voltage level; keeping the array common source and the bottom select gate of the first channel at a ground voltage level lower than the first voltage level; and floating the first bit line such that the first channel is charged to the first voltage level through the first bit line.

In some embodiments, operation (b) comprises: electrically connecting the array common source to the floated first bit line, such that the array common source is at the first voltage level; and keeping the first bit line floating, such that the first channel is charged to the second voltage level by coupling the array common source to the first bit line.

In some embodiments, operation (c) comprises: turning off the top select gate of the first channel to discharge the top select gate to the ground voltage level.

In some embodiments, the controller configured to control the word line driver and the bit line driver to: after a dedicated time of operation (c), turn on the top select gate of the first channel to set the voltage of the top select gate at a low voltage level; and ramp up the selected word line to the program voltage, such that the first channel coupled with the selected word line is charged to a third voltage level higher than the second voltage level.

In some embodiments, the memory device further comprises: a second NAND string including a second channel corresponding to a second cell to be programed; wherein the controller is further configured to control the word line driver and the bit line driver to: during the dedicated time, set a voltage of the first bit line to the first voltage level, and set a voltage of a second bit line electrically coupling with the second channel to the ground voltage level.

In some embodiments, the first voltage level is between about 2 Volts (V) and about 2.4V, the second voltage level is a summation of the first voltage level and a production of the first voltage level and a coupling ratio. In some embodiments, the coupling ratio is between about 0.3 and about 0.5.

In some embodiments, the high voltage level is about 1.5 times the first voltage level; and the low voltage level is between about 0.4 times the first voltage level and about 0.6 times the first voltage level.

In some embodiments, the dedicated time is about 2 μs.

Another aspect of the present disclosure provide a three-dimensional (3D) NAND memory device, comprising: a first NAND string including a first channel corresponding to a first cell to be inhibited to program; a word line driver; a bit line driver; and a controller configured to control the word line driver and the bit line driver to: (d) prior to applying a program voltage to a selected word line, charge an array common source electrically coupling with the first channel to a first voltage level for charging the first channel to the first voltage level, wherein the first channel corresponds to a first cell, to be inhibited to program, in the first NAND string, (e) charge a first bit line electrically coupling with the array common source for further charging the first channel to a second voltage level higher than the first voltage level, and (f) cut off the electrical coupling between the array common source and the first channel for preparing to apply the program voltage to the selected word line.

In some embodiments, operation (e) comprises: turning on a bottom select gate of the first channel and keeping a voltage of the bottom select gate at a high voltage level; charging the array common source to the first voltage level; keeping the array common source and a top select gate of first channel at a ground voltage level; and floating the array common source such that the first channel is charged to the first voltage level through the array common source.

In some embodiments, operation (e) comprises: electrically connecting the first bit line to the floated array common source, such that the first bit line is at the first voltage level; keeping the first bit line floating, such that the first channel is charged to the second voltage level by coupling the array common source to the first bit line.

In some embodiments, operation (f) comprises: turning off the bottom select gate of the first channel to discharge the bottom select gate to the ground voltage level.

In some embodiments, the controller configured to control the word line driver and the bit line driver to: after a dedicated time, turn on the top select gate of the first channel to set the voltage of the top select gate at a low voltage level; and ramp up the selected word line, such that the first channel coupled with the selected word line is charged to a third voltage level higher than the second voltage level.

In some embodiments, the memory device further comprises a second NAND string including a second channel corresponding to a second cell to be programed; wherein the controller is further configured to control the word line driver and the bit line driver to: during the dedicated time, set a voltage of the first bit line to the first voltage level, and set a voltage of a second bit line electrically coupling with the second channel to the ground voltage level.

Another aspect of the present disclosure provides an operation method for a three-dimensional (3D) NAND memory device, comprising: prior to applying a program voltage to a selected word line, charging a first bit line electrically coupling with a first channel of a first NAND string to a first voltage level for charging the first channel to the first voltage level, wherein the first channel corresponds to a first cell, to be inhibited to program, in the first NAND string; charging an array common source electrically coupling with the first bit line for further charging the first channel to a second voltage level higher than the first voltage level; and cutting off the electrical coupling between the first bit line and the first channel for preparing to apply the program voltage to the selected word line.

Another aspect of the present disclosure provides an operation method for a three-dimensional (3D) NAND memory device, comprising: prior to applying a program voltage to a selected word line, charging an array common source electrically coupling with a first channel of a first NAND string to a first voltage level for charging the first channel to the first voltage level, wherein the first channel corresponds to a first cell, to be inhibited to program, in the first NAND string; charging a first bit line electrically coupling with the floated array common source for further charging the first channel to a second voltage level higher than the first voltage level; and cutting off the electrical coupling between the array common source and the first channel for preparing to apply a program voltage to the selected word line.

Another aspect of the present disclosure provides an operation method for a three-dimensional (3D) NAND memory device, comprising: prior to applying a program voltage to a selected word line, charging a first bit line electrically coupling with a first channel to a first voltage level for charging the first channel to a first voltage level, wherein the first channel is corresponding to a first cell to be inhibited to program; charging an array common source electrically coupling with the first bit line for further charging the first channel to a second voltage level higher than the first voltage level; and cutting off the electrical coupling between the first bit line and the first channel for preparing to apply the program voltage to the selected word line.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
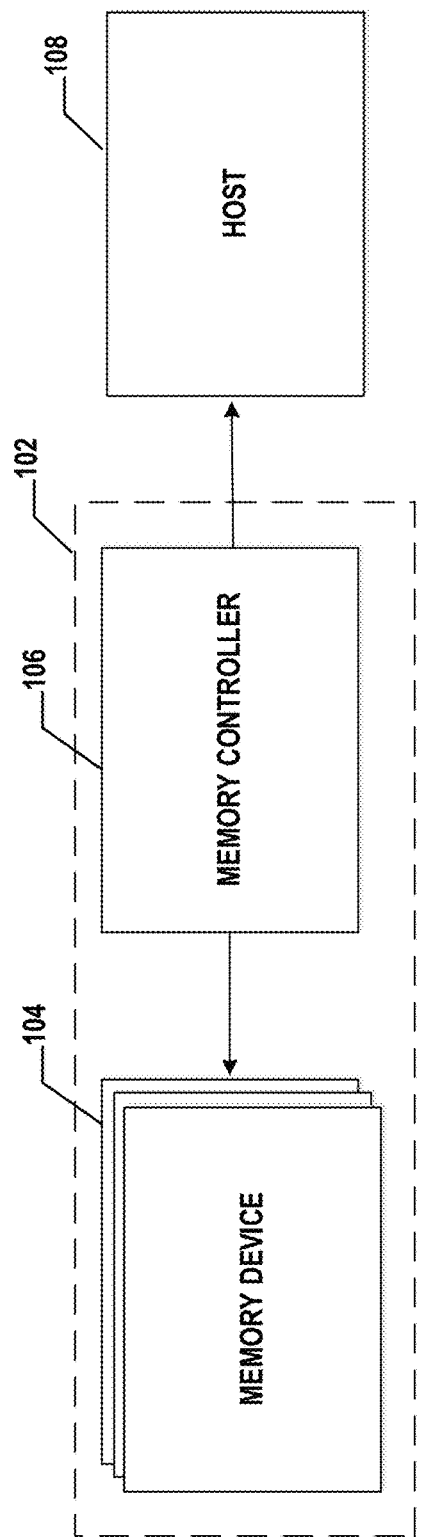
FIG. 1A illustrates a block diagram of an exemplary system having a memory device, in accordance with some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The front surface of the substrate is typically where a semiconductor device is formed, and therefore the semiconductor device is formed at a top side of the substrate unless stated otherwise. The bottom surface is opposite to the front surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1A illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1A, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a NAND Flash memory device. Consistent with the scope of the present disclosure, memory controller 106 may control the multi-pass programming on memory device 104 such that an NGS operation is enabled on all memory cells, even those passed the respective verify operations, in a non-last programming pass of the multi-pass programming. The peripheral circuits, such as the word line drivers, may apply a low voltage, e.g., ground (GND) voltage, on the DSGs of each memory string coupled to the selected word line, and may apply a low or negative voltage on the selected word line to enable an NGS operation on all memory cells coupled to the selected word line during a non-last programming pass.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, programming memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1C:
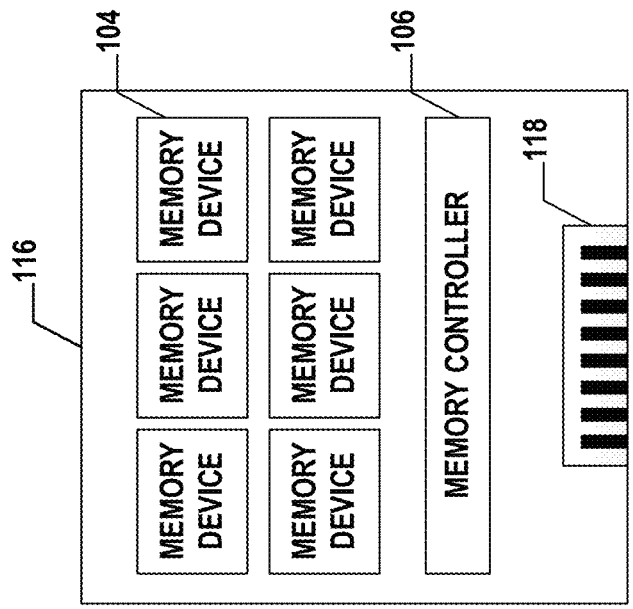
FIG. 1C illustrates a diagram of an exemplary solid-state drive (SSD) having a memory in accordance with some embodiments.
Figure 1B:
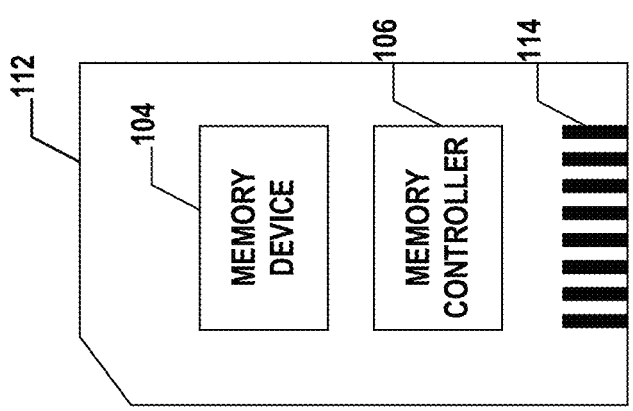
FIG. 1B illustrates a diagram of an exemplary memory card having a memory device, in accordance with some embodiments.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 1B, memory controller 106 and a single memory device 104 may be integrated into a memory card 112. Memory card 112 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 112 can further include a memory card connector 114 coupling memory card 112 with a host (e.g., host 108 in FIG. 1A). In another example as shown in FIG. 1C, memory controller 106 and multiple memory devices 104 may be integrated into an SSD 116. SSD 116 can further include an SSD connector 118 coupling SSD 116 with a host (e.g., host 108 in FIG. 1A). In some implementations, the storage capacity and/or the operation speed of SSD 116 is greater than those of memory card 112.

Figure 2:
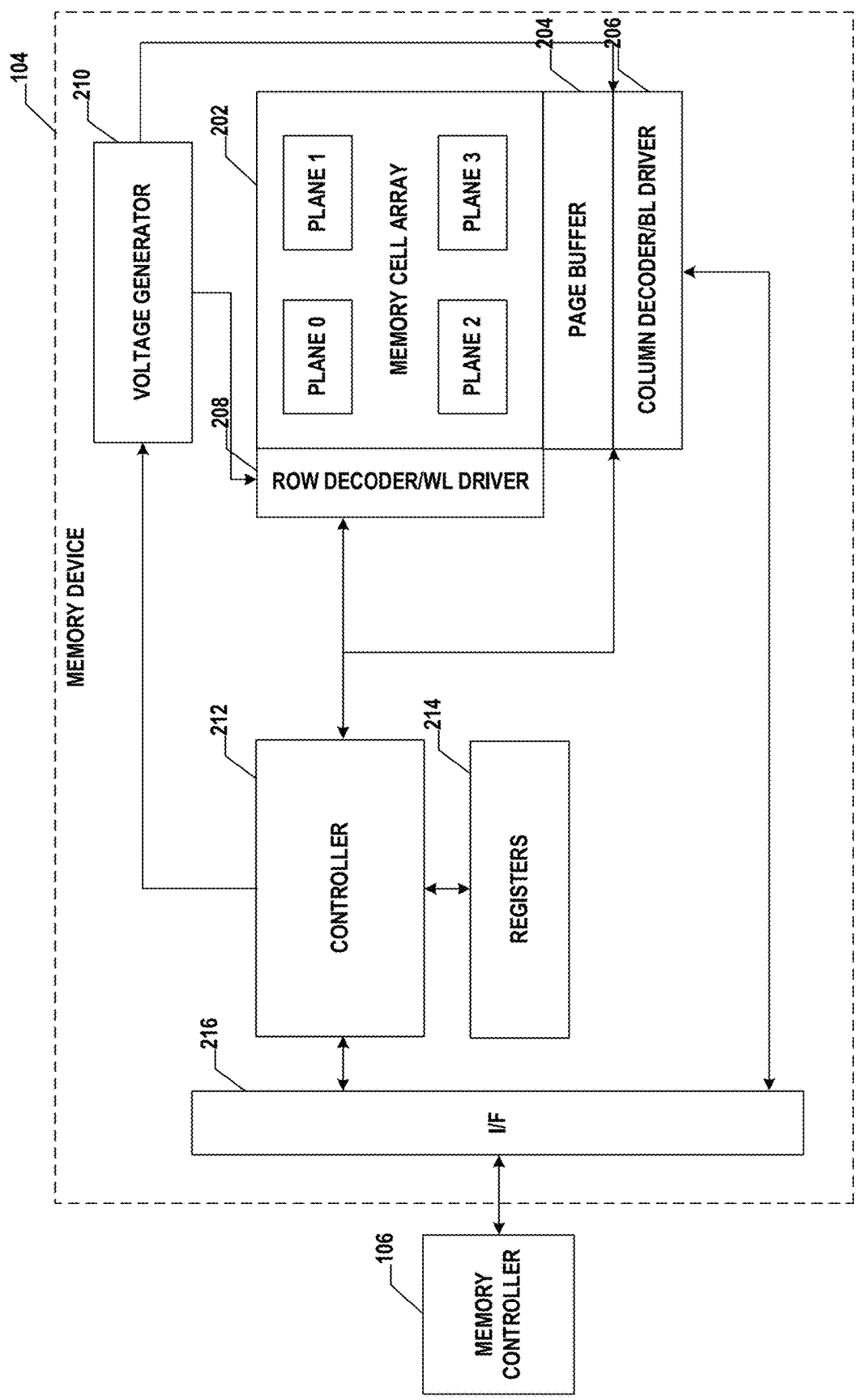
FIG. 2 illustrates a schematic block diagram of an example hardware module configuration of a memory system, in accordance with some embodiments.
Figure 3:
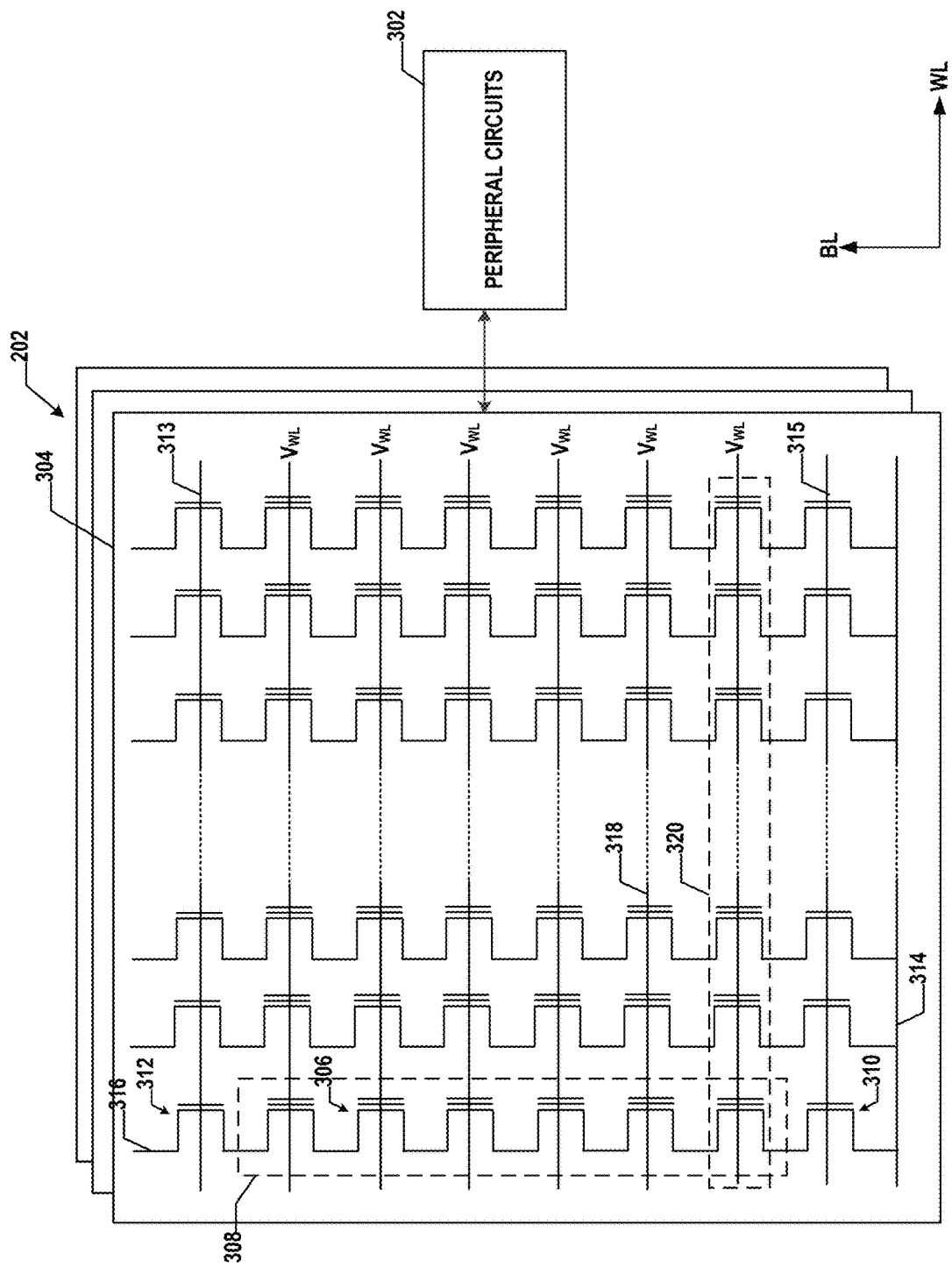
FIG. 3 illustrates a schematic circuit diagram of an exemplary memory device including peripheral circuits, according to some aspects of the present disclosure.

FIG. 2 illustrates a diagram of an exemplary memory device 104, e.g., a NAND Flash memory, having a memory cell array 202 and peripheral circuits including a page buffer 204, a column decoder/bit line driver 206, a row decoder/word line driver 208, a voltage generator 210, controller 212, registers 214, and an interface 216. FIG. 3 illustrates a schematic circuit diagram of an exemplary memory device 104 including a memory cell array 202 and peripheral circuits 302 coupled to memory cell array 202. For ease of illustration, some components in FIGS. 2 and 3 are described together. Peripheral circuits 302 can include page buffer 204, column decoder/bit line driver 206, row decoder/word line driver 208, voltage generator 210, controller 212, registers 214, and interface 216 in FIG. 2. It is understood that in some examples, additional peripheral circuits may be included as well.

In some embodiments, the voltage generator 210 can include a plurality of charge pumps and linear regulators. In some embodiments, the memory cell array can include multiple planes (i.e., plane 0, plane 1, plane 2, and plane 3). Although FIG. 2 shows four planes (plane 0, plane 1, plane 2, and plane 3), in some other embodiments, a NAND die may be divided into fewer or more than four planes (e.g., 1, 2, 6, 8, etc.). A plane includes multiple memory cells which may be grouped into memory blocks. A memory block is typically the smallest erasable entity in a NAND flash die. In one example, a memory block includes a number of cells that are coupled to the same bit line. A memory block includes one or multiple pages of cells. The size of the page can vary depending on implementation. In one example, a page has a size of 16 kB. Page sizes of less or more than 16 kB are also possible (e.g., 512 B, 2 kB, 4 kB, etc.).

It is noted that, NAND memory devices are capable of performing a read operation on one plane at a time. Such NAND memory devices have a single state machine for the whole die. If a read is being serviced on one plane, the other planes are idle. Therefore, such reads (called single plane reads) do not utilize all the planes at the same time. The lack of concurrency leads to high latency due to, for example, reads getting "stuck" behind other reads.

Another type of operation is a multi-plane operation (e.g., a quad plane read that performs a read on four planes at once). With multi-plane operations, there are multiple restrictions on the commands. For array commands, the array operation has to be the same (e.g., program, erase, or, read, but not a combination) and also the page type for those array operations has to be same. The voltage biasing to access different page types (e.g., lower page, upper page, etc.) is different, and the single state machine on the die applies the same voltage bias for all the planes. With random workloads, this requirement is hard to meet for read commands. The likelihood of receiving reads for the same page type on all four planes is low for a random workload. Therefore, the improvement in read latency with a quad plane read is minimal for a random workload. Accordingly, this feature is not typically utilized for random read workloads, which is typically considered to be a key workload for SSDs (solid state drives).

Another solution attempted was to combine reads of different page types on different planes into a single command. However, all those reads are handled as a single command by the NAND, which means there is single start and completion for the reads. Therefore, with such a technique the read duration is dominated by the worst (e.g., slowest) page type and asynchronous reads are not possible. Accordingly, combining different page types on different planes into a single command also results in minimal increases in performance and Quality of Service (QoS).

In contrast to conventional NAND operations, independent multi-plane operations enable independent and concurrent operations per plane. Separate state machines for each plane enable application of different bias voltages for each plane to independently and concurrently service requests. All NAND array commands are allowed independently on the plane level, enabling significant performance improvements. An array command is a command that causes an array operation, such as programming data to the array, reading data from the array, erasing a block, or other operations on the array.

In one example, each plane can receive and service a different array command (e.g., read command, program command, erase command, etc.), and the commands can be sent and completed at different times. Non-array commands (e.g., reset command, timing mode change command, etc.) can be maintained as die-level commands. In an alternative example, read operations are allowed independently on the plane level. Other operations, such as program command and erase command, are die-level operations. Further, some supporting commands for read, such as read status and read column enhanced may also be plane-level commands.

As shown in FIG. 3, memory cell array 202 can be a NAND Flash memory cell array in which memory cells 306 are provided in the form of an array of NAND memory strings 308 (also referred as "channels") each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor. In one example, the memory cell 306 includes a transistor with a replacement gate. A memory cell 306 with a replacement gate typically has a low resistance gate (e.g., a tungsten gate) and a charge trap layer between the gate and the channel where charge is trapped or stored to represent one or more bit values. In another example, a memory cell 306 can include a transistor with a floating gate (e.g., a high resistance poly gate) that stores charge indicative of one or more bit values. Other architectures are also possible.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can include a bottom select gate (BSG) 310 at its source end and a drain select gate (DSG) 312 at its drain end. In some embodiments, the BSG 310 can be a source select gate (SSG), and the TSG 312 can be a drain select gate (DSG). BSG 310 and TSG 312 are respective the gate electrodes of an SSG transistor and a DSG transistor and can be configured to activate selected NAND memory strings 308 (columns of the array or channels) during read and program operations. In some implementations, BSGs 310 of NAND memory strings 308 in the same block 304 are coupled through a same source line (SL) 314, e.g., an array common source (ACS), for example, to the ground. TSG 312 of each NAND memory string 308 is coupled to a respective bit line 316 from which data can be read via an output bus (not shown), according to some implementations. In some implementations, each NAND memory string 308 is configured to be selected or deselected by applying a select voltage (e.g., above the threshold voltage of the transistor having TSG 312) or a deselect voltage (e.g., 0 V) to respective TSG 312 through one or more TSG lines 313 and/or by applying a select voltage (e.g., above the threshold voltage of the transistor having BSG 310) or a deselect voltage (e.g., 0 V) to respective BSG 310 through one or more BSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can correspond to the number of NAND memory strings 308 coupled by word line 318 in one block 304. Each word line 318 can include a plurality of control gates (gate electrodes) at each memory cell 306 in respective page 320 and a gate line coupling the control gates. In some cases, dummy word lines, which contain no user data, can also be used in the memory array adjacent to the select gate transistors. Such dummy word lines can shield the edge data word line from certain edge effects.

Peripheral circuits 302 can be coupled to memory cell array 202 through bit lines 316, word lines 318, source lines 314, SSG lines 315, and DSG lines 313. Peripheral circuits 302 may apply voltages on bit lines 316, word lines 318, source lines 314, SSG lines 315, and DSG lines 313 to perform multi-pass programming including the proposed NGS scheme in a non-last programming pass. As described above, peripheral circuits 302 can include any suitable circuits for facilitating the operations of memory cell array 202 by applying and sensing voltage signals and/or current signals through bit lines 316 to and from each target memory cell 306 through word lines 318, source lines 314, SSG lines 315, and DSG lines 313. Peripheral circuits 302 can include various types of peripheral circuits formed using MOS technologies.

A programming sequence for a group of memory cells 306 can include programming of all of the intended pages into the group of memory cells 306. A programming sequence can include one or more programming passes. A programming pass (which can include one or more programming loops) can program one or more pages. A programming pass can include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell can include changing the voltage difference between a control gate and a channel of the cell in order to change the threshold voltage of the cell. Accordingly, a voltage of a word line (coupled to the control gate of the target cell) and/or a channel of the cell can be set in order to effectuate application of an effective program voltage. As a program voltage is commonly used to refer to a voltage applied to a word line, the effective program voltage can be the voltage difference between a control gate and channel of a cell (which in instances where the channel is held at 0V can be synonymous with a program voltage).

Figure 4A:
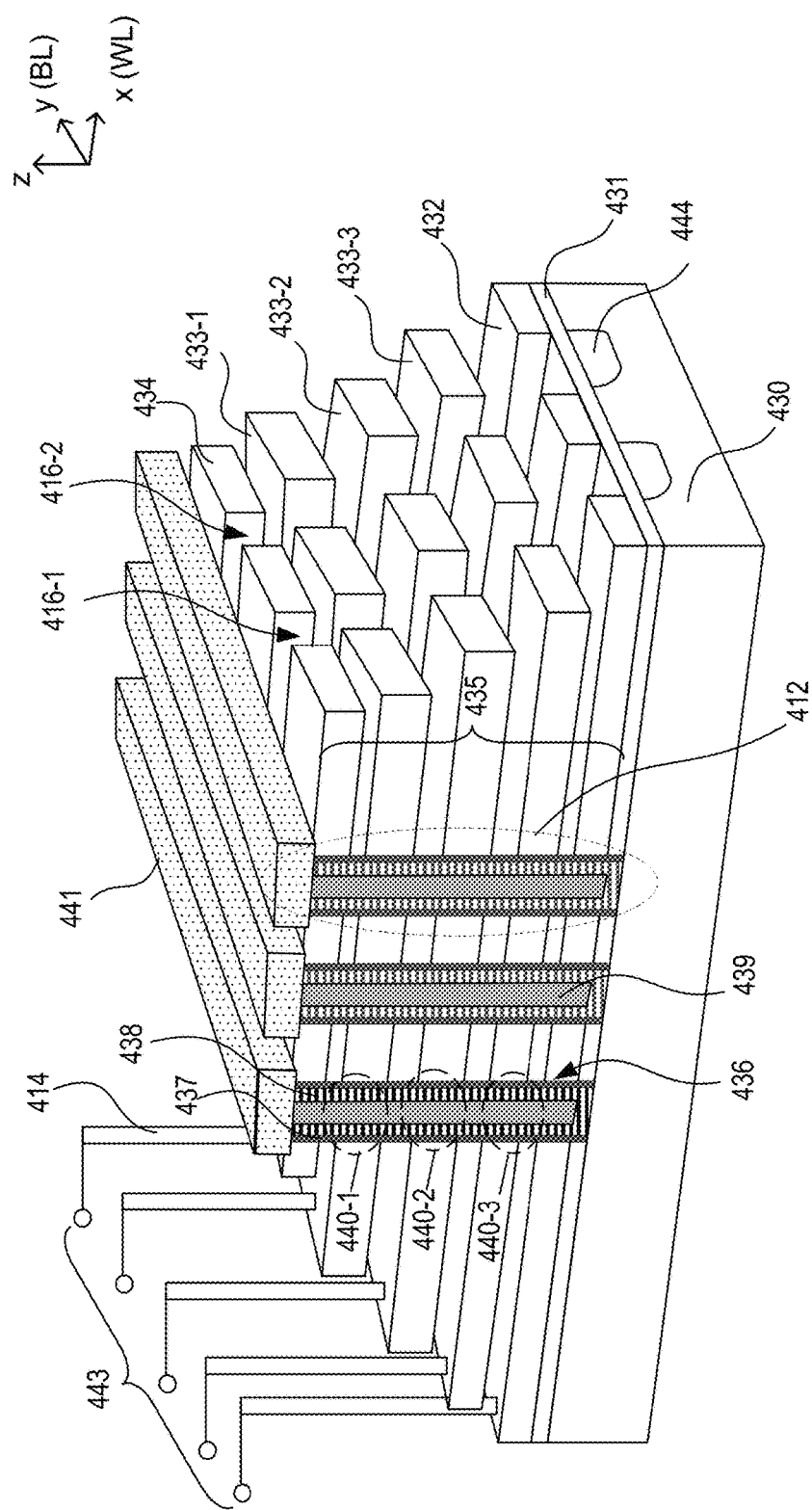
FIG. 4A illustrates a perspective view of a portion of an exemplary three-dimensional (3D) memory array structure, in accordance with some embodiments.

FIG. 4A illustrates a perspective view of a portion of an exemplary three-dimensional (3D) memory cell array structure 400, according to some embodiments. The memory cell array structure 400 includes a substrate 430, an insulating film 431 over the substrate 430, a tier of bottom select gates (BSGs) 432 over the insulating film 431, and a plurality of tiers of control gates 433, also referred to as "word lines" (WLs) stacking on top of the BSGs 432 to form a film stack 435 of alternating conductive and dielectric layers. The dielectric layers adjacent to the tiers of control gates are not shown in FIG. 4A for clarity.

The control gates of each tier are separated by slit structures 416-1 and 416-2 through the film stack 435. The memory cell array structure 400 also includes a tier of top select gates (TSGs) 434 over the stack of control gates 433. The stack of TSGs 434, control gates 4133 and BSGs 432 is also referred to as "gate electrodes." The memory cell array structure 400 further includes memory strings 412 and doped source line regions 444 in portions of substrate 430 between adjacent BSGs 432. Each memory strings 412 includes a channel hole 436 extending through the insulating film 431 and the film stack 435 of alternating conductive and dielectric layers. Memory strings 412 also includes a memory film 437 on a sidewall of the channel hole 436, a channel layer 438 over the memory film 437, and a core filling film 439 surrounded by the channel layer 438. A memory cell 440 can be formed at the intersection of the control gate 433 and the memory string 412. A portion of the channel layer 438 underneath the control gate 433 is also referred to as the channel of the memory cell 440. The memory cell array structure 400 further includes a plurality of bit lines (BLs) 441 connected with the memory strings 412 over the TSGs 434. The memory cell array structure 400 also includes a plurality of metal interconnect lines 443 connected with the gate electrodes through a plurality of contact structures 414. The edge of the film stack 435 is configured in a shape of staircase to allow an electrical connection to each tier of the gate electrodes.

In FIG. 4A, for illustrative purposes, three tiers of control gates 433-1, 433-2, and 433-3 are shown together with one tier of TSG 434 and one tier of BSG 432. In this example, each memory string 412 can include three memory cells 440-1, 440-2 and 440-3, corresponding to the control gates 433-1, 433-2 and 433-3, respectively. The number of control gates and the number of memory cells can be more than three to increase storage capacity. The memory cell array structure 400 can also include other structures, for example, TSG cut structures, common source contacts and dummy memory strings, etc. These structures are not shown in FIG. 4A for simplicity.

Figure 4B:
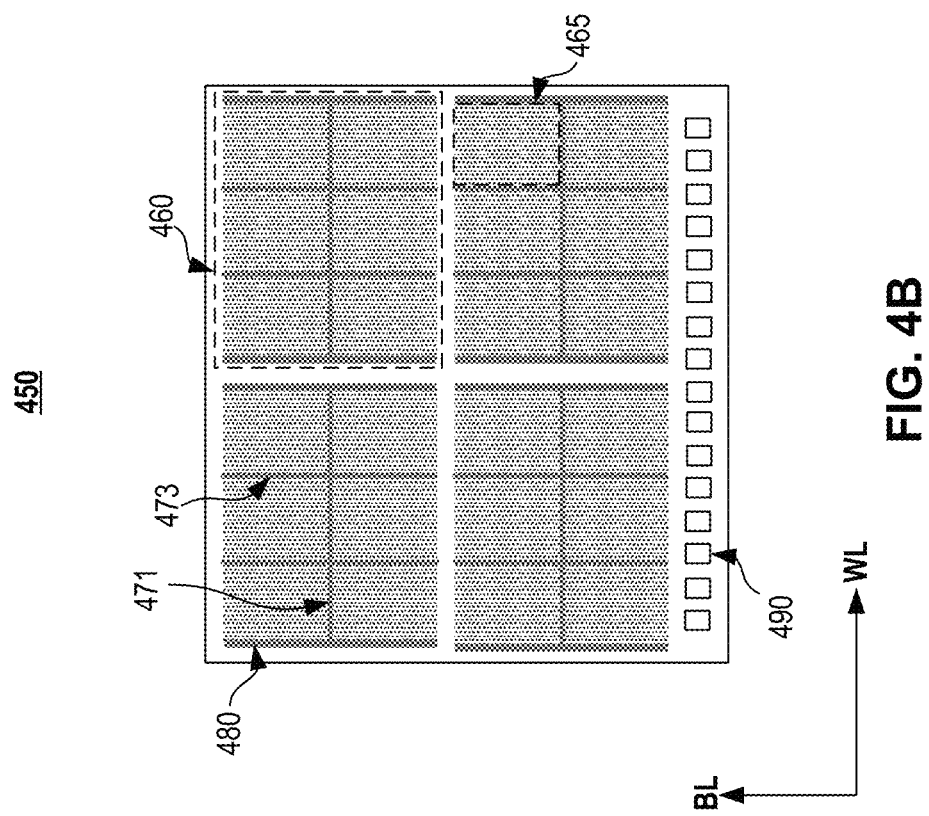
FIG. 4B illustrates a schematic diagram of an exemplary 3D memory device in a plan view, in accordance with some embodiments.

FIG. 4B illustrates a schematic diagram of an exemplary 3D memory device 450 in the plan view, according to some embodiments of the present disclosure. 3D memory device 450 can include a plurality of channel structure regions, such as memory planes, memory blocks, memory fingers, etc., and one or more through array contact (TAC) structures can be formed between two neighboring channel structure regions. In some embodiments as shown in FIG. 4B, 3D memory device 450 can include four or more memory planes 460, each of which can include a plurality of memory blocks 465. It is noted that, the arrangement of memory planes 460 in 3D memory device 450 and the arrangement of memory blocks 465 in each memory plane 460 illustrated in FIG. 4B are only used as an example, which is not limit the scope of the present disclosure.

TAC structures can include one or more bit line (BL) TAC regions 471 that are sandwiched by two neighboring memory blocks 465 in the bit line direction of the 3D memory device (labeled as "BL" in figures) and extended along the word line direction of the 3D memory device (labeled as "WL" in figures), one or more word line (BL) TAC regions 473 that are sandwiched by two neighboring memory blocks 465 in the word line direction (WL) and extended along the bit line direction (BL), and one or more staircase structure (SS) TAC regions 480 that are located at the edges of each memory plane 460.

In some embodiments, 3D memory device 450 can include a plurality of contact pads 490 arranged in a line at an edge of the 3D memory device 450. Interconnect contact can be used for electrically interconnect 3D memory device 450 to any suitable device and/or interface that provide driving power, receive control signal, transmit response signal, etc.

In some embodiments, the controller 212 as shown in FIG. 2 is configured to control a channel preparation operation, which is an important phase to reduce program disturb in a program algorithm. The channel preparation operation can be used to prepare an initial state of each channel, then boost an inhibit channel with word lines. It is noted that, the inhibit channel is defined as a channel that only includes inhibit cells and does not include a program cell. Generally, there are two ways to perform the channel preparation operation. The first method is to boost the inhibit channel from the top select gate (TSG) side, and the second method is to boost the inhibit channel from the bottom select gate (BSG) side. For example, in the first method, the TSG can be turned on, and a voltage VDD can be applied to the bit line, such that the inhibit channel can be charged to VDD through the bit line. As another example, in the second method, the BSG can be turned on, a voltage VDD can be applied to the array common source (ACS), such that the inhibit channel can be charged to VDD through the ACS.

As described above, in order to reducing program disturb, higher channel voltage is needed to be boosted on to the inhibit channel. However, the maximum voltage for the inhibit channel depends on the circuit of BLs or ACS, and is limited to VDD in both existing methods. If extra power supply is added into the periphery circuit to provide higher voltage, the CMOS cost can be significantly increased. The present disclosure provides new methods to decrease program disturb by array source coupling, which can provide a higher channel voltage, e.g., a voltage higher than VDD, to the inhibit channels without adding any extra circuit cost.

Figure 5:
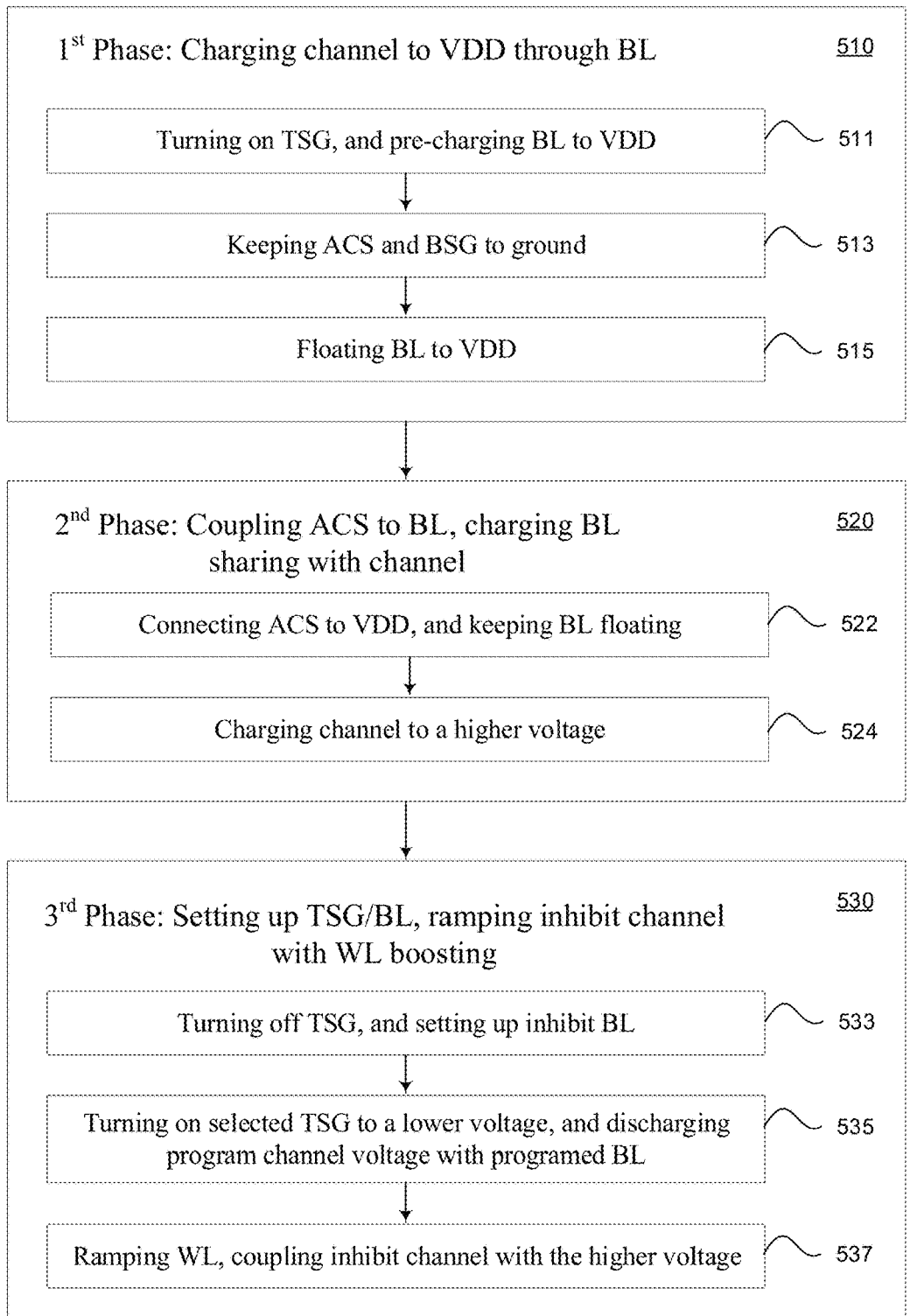
FIG. 5 illustrates a flowchart of an example method of performing channel preparation operation by array source coupling, according to some embodiments.
Figure 6:
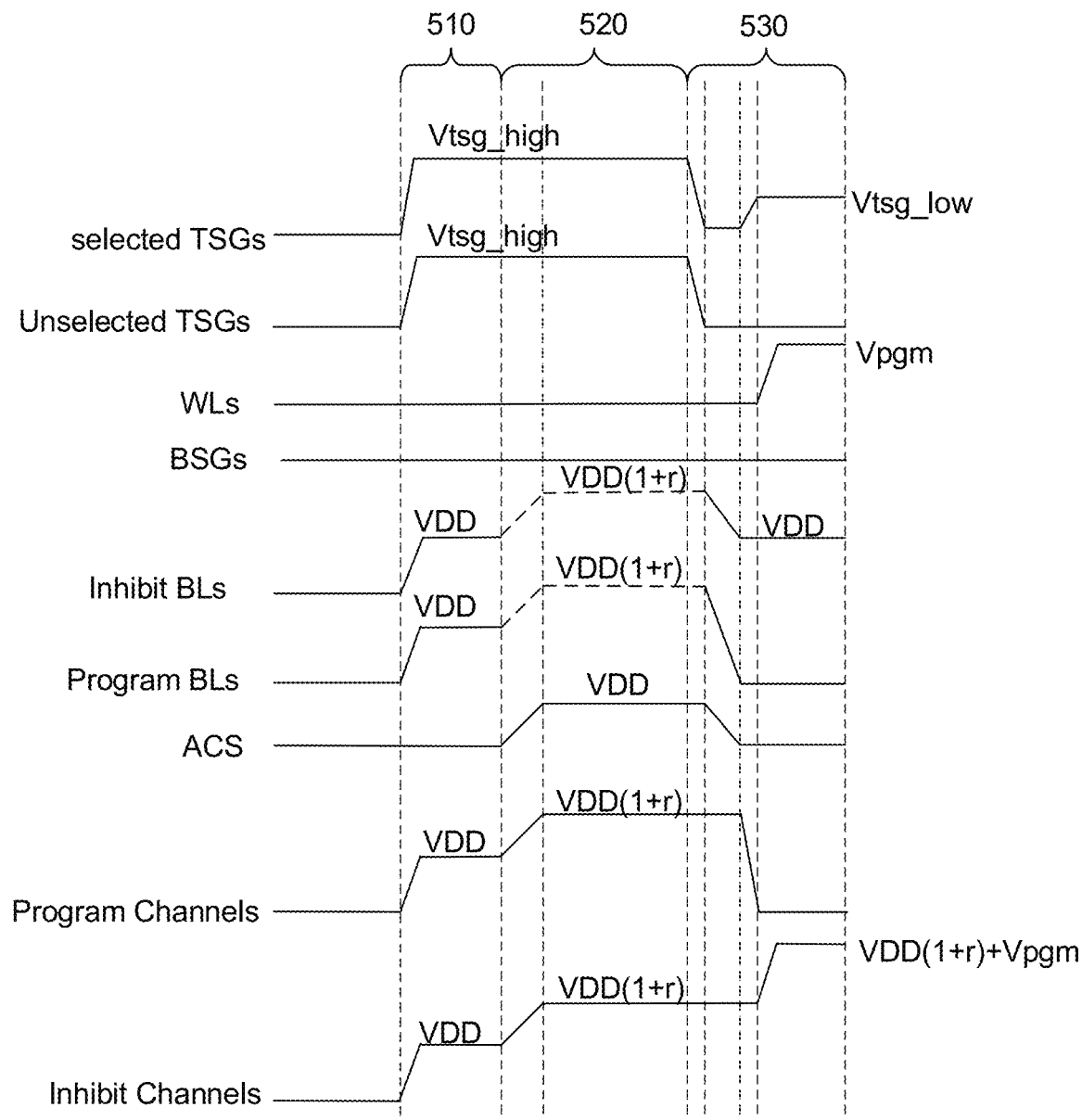
FIG. 6 illustrates a schematic diagram illustrating voltage changing of various wires in the circuit during various phases of the channel preparation operation of FIG. 5, according to some embodiments.

FIG. 5 illustrates a flowchart of a first example method of performing channel preparation operation by array source coupling, according to some embodiments. FIG. 6 illustrates a schematic diagram illustrating voltage changing of various wires in the circuit during various phases of the channel preparation operation in connection with FIG. 5, according to some embodiments.

Referring to FIG. 5, method 500 starts at first phase 510, in which multiple channels can be charged to a voltage VDD through bit lines BLs. Also referring to FIG. 6, the initial states of all wires are on the ground state. The first phase 510 can include step 511, in which the top select gates TSGs can be turned on, and the bit lines BLs can be pre-charged to VDD. As such, the TSGs, including the selected TSGs and unselected TSGs, can be charged to the voltage $V_{tsg\text{-}high}$, while the BLs, including inhibit bit lines and program bit lines, can be charged to VDD, as shown in FIG. 6. In some embodiments, the voltage VDD can have a value of 2.2v+/− about 10%, and the voltage $V_{tsg\text{-}high}$ can have a value about 1.5 times of voltage VDD. The $1^{st}$ phase 510 can further include step 513, in which the voltages of ACS and BSGs can be kept at the ground level. At this moment, the channels, including program channels and inhibit channels, can be charged to a voltage close to VDD through the BLs and TSGs. The $1^{st}$ phase 510 can further include step 515, in which the BLs can be floated at the end of the $1^{st}$ phase 510.

The method 500 can then proceed to second phase 520, in which the ACS can be coupled to the BLs, such that the BLs charging can be shared with the channels. The second phase 520 can include step 522, in which the ACS can be connected to VDD. Since the BLs are floating, the BLs can be coupled up through the gap between ACS and the BLs. Therefore, the final voltage of BLs, including inhibit bit lines and program bit lines, can go up to $VDD(1+R_{ACS\text{-}BL})$ as shown in FIG. 6, wherein $R_{ACS\text{-}BL}$ is the ACS-couple-BL ratio which has a value between 0.3 and 0.5. The second phase 520 can further include step 524, in which the channels can be charged through the BLs up to a voltage higher than VDD. In some embodiments, the channels, including program channels and inhibit channels, can be charged to $VDD(1+R_{ACS\text{-}BL})$ as shown in FIG. 6.

The method 500 can then proceed to third phase 530, in which the TSGs and BLs can be set up before WLs boosting, and the inhibit channels can be ramped up with WLs boosting. The third phase 530 can include step 533, in which the TSGs, including the selected TSGs and unselected TSGs, can be turned off, such that the TSG voltage can be go down to the ground level, as shown in FIG. 6. During a dedicated timing (e.g., about 2 µs) for discharging the TSGs, the ACS voltage and the program BL voltage can be set up to ground level, while the inhibit BL voltage can be kept as VDD. The third phase 530 can then include step 535, in which the selected TSGs can be turned on again to the voltage $V_{tsg\text{-}low}$, which can have a value between 0.4 times VDD and 0.6 times VDD. In the meantime, the voltage of the program channel can be discharged to ground level with the program BLs. The third phase 530 can further include step 537, in which the selected WLs can be ramped up to the program voltage $V_{pgm}$. Since the inhibit channels are coupled with the selected WLs, the voltage of the inhibit channel voltage can be boosted from $VDD(1+R_{ACS\text{-}BL})$ up to $VDD(1+R_{ACS\text{-}BL})+V_{prm}$, as shown in FIG. 6.

Figure 7:
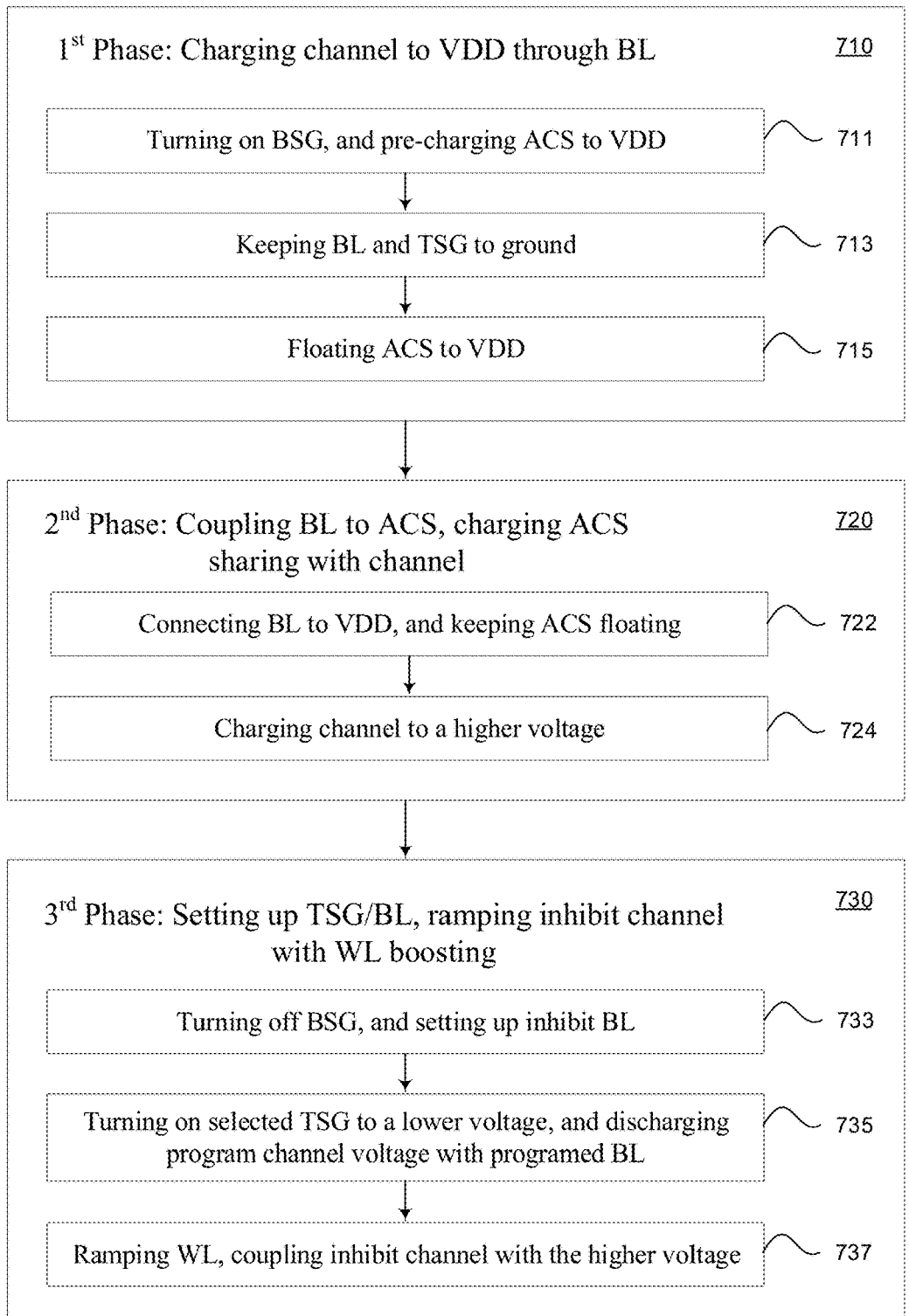
FIG. 7 illustrates a flowchart of another example method of performing channel preparation operation by array source coupling, according to some embodiments.
Figure 8:
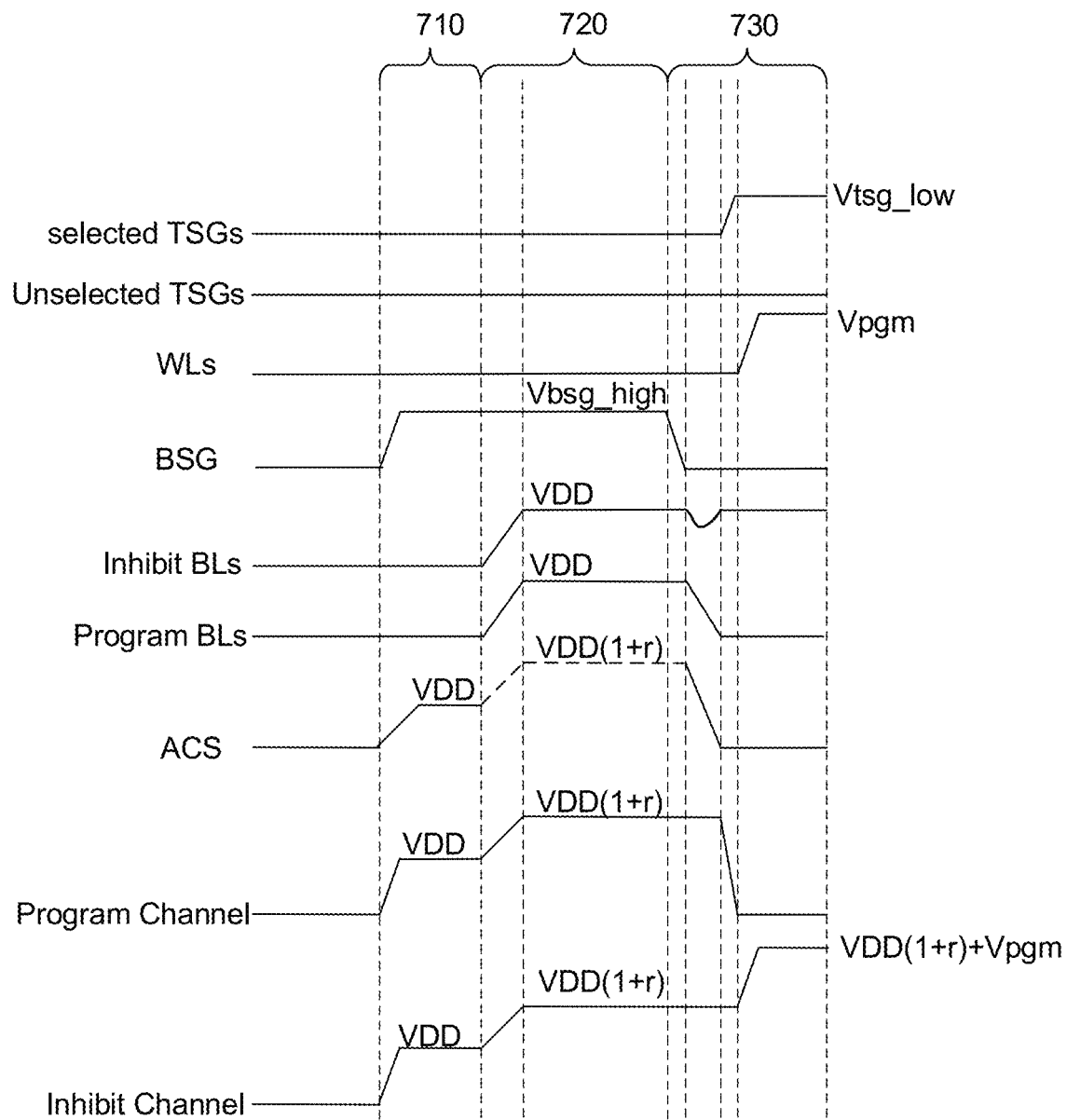
FIG. 8 illustrates a schematic diagram illustrating voltage changing of various wires in the circuit during various phases of the channel preparation operation of FIG. 7, according to some embodiments.

Turning to FIG. 7, a flowchart of a second example method of performing channel preparation operation by array source coupling is illustrated, according to some embodiments. FIG. 8 illustrates a schematic diagram illustrating voltage changing of various wires in the circuit during various phases of the channel preparation operation in connection with FIG. 7, according to some embodiments.

Referring to FIG. 7, method 700 starts at first phase 710, in which multiple channels can be charged to a voltage VDD through array common source (ACS). Also referring to FIG. 8, the initial states of all wires are on the ground state. The first phase 710 can include step 711, in which the bottom select gates BSGs can be turned on, and the array common source ACS can be pre-charged to VDD. As such, the BSGs can be charged to the voltage $V_{bsg\text{-}high}$, while the ACS can be charged to VDD, as shown in FIG. 8. In some embodiments, the voltage VDD can have a value of 2.2v+/−about 10%, and the voltage $V_{bsg\text{-}high}$ can have a value about 1.5 times of voltage VDD. The first phase 710 can further include step 713, in which BLs and TSGs can be kept at ground. At this moment, the channels, including program channels and inhibit channels, can be charged to a voltage close to VDD through the ACS and BSGs. The first phase 710 can further include step 715, in which the ACS can be floated at the end of the first phase 710.

The method 700 can then proceed to second phase 720, in which the BLs can be coupled to the ACS, such that the ACS charging can be shared with the channels. The second phase 720 can include step 722, in which the BLs, including inhibit bit lines and program bit lines, can be connected to VDD. Since the ACS is floating, the ACS can be coupled up through the gap between ACS and the BLs. Therefore, the final voltage of ACS can go up to $VDD(1+R_{BL\text{-}ACS})$ as shown in FIG. 8, wherein $R_{BL\text{-}ACS}$ is the BL-couple-ACS ratio which has a value between 0.1 and 0.2. The second phase 720 can further include step 724, in which the channels can be charged through the ACS up to a voltage higher than VDD. In some embodiments, the channels, including program channels and inhibit channels, can be charged to $VDD(1+R_{BL\text{-}ACS})$ as shown in FIG. 8.

The method 700 can then proceed to third phase 730, in which the TSGs and BLs can be set up before WLs boosting, and the inhibit channels can be ramped up with WLs boosting. The third phase 730 can include step 733, in which the BSGs can be turned off, such that the BSG voltage can be go down to the ground level, as shown in FIG. 8. During a dedicated timing (e.g., about 2 μs) for discharging the BSGs, the ACS voltage and the program BL voltage can be set up to ground level, while the inhibit BL voltage can be set up to VDD. The third phase 730 can then include step 735, in which the selected TSGs can be turned on again to the voltage $V_{tsg-low}$, which can have a value between 0.4 times VDD and 0.6 times VDD. In the meantime, the voltage of program channel can be discharged to ground level with the program BLs. The third phase 730 can further include step 737, in which the selected WLs can be ramped up to the program voltage $V_{pgm}$. Since the inhibit channels are coupled with the selected WLs, the voltage of the inhibit channel voltage can be boosted from $VDD(1+R_{BL-ACS})$ up to $VDD(1+R_{BL-ACS})+V_{pgm}$, as shown in FIG. 8.

It should be noted that the above steps in each phase of the flow diagrams of FIGS. 5 and 7 can be executed or performed by controller 212 in connection of the FIG. 2 in any order or sequence not limited to the order and sequence shown and described in the figures. Also, some of the above steps in each phase of the flow diagram of FIGS. 5 and 7 can be executed or performed substantially simultaneously where appropriate or in parallel to reduce latency and processing times. Furthermore, it should be noted that FIGS. 5 and 7 are provided as an example only. At least some of the steps shown in the figures may be performed in a different order than represented, performed concurrently, or altogether omitted.

Accordingly, method, systems, and media for performing channel preparation operation by using array source coupling. The discloses methods can reduce program disturb by providing a higher channel voltage, e.g., a voltage higher than VDD, to the inhibit channels without adding any extra circuit cost.

One aspect of the present disclosure provides a three-dimensional (3D) NAND memory device comprising: a first NAND string including a first channel corresponding to a first cell to be inhibited to program; a word line driver; a bit line driver; and a controller configured to control the word line driver and the bit line driver to: (a) prior to applying a program voltage to a selected word line, charge a first bit line electrically coupling with the first channel to a first voltage level for charging the first channel to the first voltage level, (b) charge an array common source electrically coupling with the first bit line for further charging the first channel to a second voltage level higher than the first voltage level, and (c) cut off the electrical coupling between the first bit line and the first channel for preparing to apply the program voltage to the selected word line.

In some embodiments, operation (a) comprises: turning on a top select gate of the first channel and keeping a voltage of the top select gate at a high voltage level; charging the first bit line to the first voltage level; keeping the array common source and the bottom select gate of the first channel at a ground voltage level lower than the first voltage level; and floating the first bit line such that the first channel is charged to the first voltage level through the first bit line.

In some embodiments, operation (b) comprises: electrically connecting the array common source to the floated first bit line, such that the array common source is at the first voltage level; and keeping the first bit line floating, such that the first channel is charged to the second voltage level by coupling the array common source to the first bit line.

In some embodiments, operation (c) comprises: turning off the top select gate of the first channel to discharge the top select gate to the ground voltage level.

In some embodiments, the controller configured to control the word line driver and the bit line driver to: after a dedicated time of operation (c), turn on the top select gate of the first channel to set the voltage of the top select gate at a low voltage level; and ramp up the selected word line to the program voltage, such that the first channel coupled with the selected word line is charged to a third voltage level higher than the second voltage level.

In some embodiments, the memory device further comprises: a second NAND string including a second channel corresponding to a second cell to be programed; wherein the controller is further configured to control the word line driver and the bit line driver to: during the dedicated time, set a voltage of the first bit line to the first voltage level, and set a voltage of a second bit line electrically coupling with the second channel to the ground voltage level.

In some embodiments, the first voltage level is between about 2 Volts (V) and about 2.4V, the second voltage level is a summation of the first voltage level and a production of the first voltage level and a coupling ratio. In some embodiments, the coupling ratio is between about 0.3 and about 0.5.

In some embodiments, the high voltage level is about 1.5 times the first voltage level; and the low voltage level is between about 0.4 times the first voltage level and about 0.6 times the first voltage level.

In some embodiments, the dedicated time is about 2 μs.

Another aspect of the present disclosure provide a three-dimensional (3D) NAND memory device, comprising: a first NAND string including a first channel corresponding to a first cell to be inhibited to program; a word line driver; a bit line driver; and a controller configured to control the word line driver and the bit line driver to: (d) prior to applying a program voltage to a selected word line, charge an array common source electrically coupling with the first channel to a first voltage level for charging the first channel to the first voltage level, wherein the first channel corresponds to a first cell, to be inhibited to program, in the first NAND string, (e) charge a first bit line electrically coupling with the array common source for further charging the first channel to a second voltage level higher than the first voltage level, and (f) cut off the electrical coupling between the array common source and the first channel for preparing to apply the program voltage to the selected word line.

In some embodiments, operation (e) comprises: turning on a bottom select gate of the first channel and keeping a voltage of the bottom select gate at a high voltage level; charging the array common source to the first voltage level; keeping the array common source and a top select gate of first channel at a ground voltage level; and floating the array common source such that the first channel is charged to the first voltage level through the array common source.

In some embodiments, operation (e) comprises: electrically connecting the first bit line to the floated array common source, such that the first bit line is at the first voltage level; keeping the first bit line floating, such that the first channel is charged to the second voltage level by coupling the array common source to the first bit line.

In some embodiments, operation (f) comprises: turning off the bottom select gate of the first channel to discharge the bottom select gate to the ground voltage level.

In some embodiments, the controller configured to control the word line driver and the bit line driver to: after a dedicated time, turn on the top select gate of the first channel to set the voltage of the top select gate at a low voltage level;

and ramp up the selected word line, such that the first channel coupled with the selected word line is charged to a third voltage level higher than the second voltage level.

In some embodiments, the memory device further comprises a second NAND string including a second channel corresponding to a second cell to be programed; wherein the controller is further configured to control the word line driver and the bit line driver to: during the dedicated time, set a voltage of the first bit line to the first voltage level, and set a voltage of a second bit line electrically coupling with the second channel to the ground voltage level.

Another aspect of the present disclosure provides an operation method for a three-dimensional (3D) NAND memory device, comprising: prior to applying a program voltage to a selected word line, charging a first bit line electrically coupling with a first channel of a first NAND string to a first voltage level for charging the first channel to the first voltage level, wherein the first channel corresponds to a first cell, to be inhibited to program, in the first NAND string; charging an array common source electrically coupling with the first bit line for further charging the first channel to a second voltage level higher than the first voltage level; and cutting off the electrical coupling between the first bit line and the first channel for preparing to apply the program voltage to the selected word line.

Another aspect of the present disclosure provides an operation method for a three-dimensional (3D) NAND memory device, comprising: prior to applying a program voltage to a selected word line, charging an array common source electrically coupling with a first channel of a first NAND string to a first voltage level for charging the first channel to the first voltage level, wherein the first channel corresponds to a first cell, to be inhibited to program, in the first NAND string; charging a first bit line electrically coupling with the floated array common source for further charging the first channel to a second voltage level higher than the first voltage level; and cutting off the electrical coupling between the array common source and the first channel for preparing to apply a program voltage to the selected word line.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) NAND memory device, comprising:
    a first NAND string including a first channel corresponding to a first cell to be inhibited to program;
    a word line driver;
    a bit line driver; and
    a controller configured to control the word line driver and the bit line driver to:
        (a) prior to applying a program voltage to a selected word line, charge a first bit line electrically coupling with the first channel to a first voltage level for charging the first channel to the first voltage level,
        (b) charge an array common source electrically coupling with the first bit line for further charging the first channel to a second voltage level higher than the first voltage level, and
        (c) cut off the electrical coupling between the first bit line and the first channel for preparing to apply the program voltage to the selected word line.

2. The memory device of claim 1, wherein operation (a) comprises:
    turning on a top select gate of the first channel and keeping a voltage of the top select gate at a high voltage level;
    charging the first bit line to the first voltage level;
    keeping the array common source and a bottom select gate of the first channel at a ground voltage level lower than the first voltage level; and
    floating the first bit line such that the first channel is charged to the first voltage level through the first bit line.

3. The memory device of claim 2, wherein operation (b) comprises:
    electrically connecting the array common source to the floated first bit line, such that the array common source is at the first voltage level; and
    keeping the first bit line floating, such that the first channel is charged to the second voltage level by coupling the array common source to the first bit line.

4. The memory device of claim 3, wherein operation (c) comprises:
    turning off the top select gate of the first channel to discharge the top select gate to the ground voltage level.

5. The memory device of claim 4, wherein the controller is configured to control the word line driver and the bit line driver to:
    after a dedicated time of operation (c), turn on the top select gate of the first channel to set the voltage of the top select gate at a low voltage level; and
    ramp up the selected word line to the program voltage, such that the first channel coupled with the selected word line is charged to a third voltage level higher than the second voltage level.

6. The memory device of claim 4, further comprising:
    a second NAND string including a second channel corresponding to a second cell to be programmed;
    wherein the controller is further configured to control the word line driver and the bit line driver to:

during the dedicated time, set a voltage of the first bit line to the first voltage level, and set a voltage of a second bit line electrically coupling with the second channel to the ground voltage level.

7. The memory device of claim 1, wherein:
the first voltage level is between about 2 Volts (V) and about 2.4V; and
the second voltage level is a summation of the first voltage level and a product of the first voltage level and a coupling ratio.

8. The memory device of claim 7, wherein the coupling ratio is between about 0.3 and about 0.5.

9. The memory device of claim 5, wherein:
the high voltage level is about 1.5 times the first voltage level; and
the low voltage level is between about 0.4 times the first voltage level and about 0.6 times the first voltage level.

10. The memory device of claim 5, wherein the dedicated time is about 2 µs.

11. A three-dimensional (3D) NAND memory device, comprising:
a first NAND string including a first channel corresponding to a first cell to be inhibited to program;
a word line driver;
a bit line driver; and
a controller configured to control the word line driver and the bit line driver to:
(a) prior to applying a program voltage to a selected word line, charge an array common source electrically coupling with the first channel to a first voltage level for charging the first channel to the first voltage level, wherein the first channel corresponds to a first cell, to be inhibited to program, in the first NAND string,
(b) charge a first bit line electrically coupling with the array common source for further charging the first channel to a second voltage level higher than the first voltage level, and
(c) cut off the electrical coupling between the array common source and the first channel for preparing to apply the program voltage to the selected word line.

12. The memory device of claim 11, wherein operation (a) comprises:
turning on a bottom select gate of the first channel and keeping a voltage of the bottom select gate at a high voltage level;
charging the array common source to the first voltage level;
keeping the array common source and a top select gate of first channel at a ground voltage level; and
floating the array common source such that the first channel is charged to the first voltage level through the array common source.

13. The memory device of claim 12, wherein operation (b) comprises:
electrically connecting the first bit line to the floated array common source, such that the first bit line is at the first voltage level; and
keeping the first bit line floating, such that the first channel is charged to the second voltage level by coupling the array common source to the first bit line.

14. The memory device of claim 13, wherein operation (c) comprises:
turning off the bottom select gate of the first channel to discharge the bottom select gate to the ground voltage level.

15. The memory device of claim 14, wherein the controller configured to control the word line driver and the bit line driver to:
after a dedicated time, turn on the top select gate of the first channel to set the voltage of the top select gate at a low voltage level; and
ramp up the selected word line, such that the first channel coupled with the selected word line is charged to a third voltage level higher than the second voltage level.

16. The memory device of claim 15, further comprising:
a second NAND string including a second channel corresponding to a second cell to be programmed;
wherein the controller is further configured to control the word line driver and the bit line driver to:
during the dedicated time, set a voltage of the first bit line to the first voltage level, and set a voltage of a second bit line electrically coupling with the second channel to the ground voltage level.

17. The memory device of claim 11, wherein:
the first voltage level is between about 2V and about 2.4V; and
the second voltage level is a summation of the first voltage level and a product of the first voltage level and a coupling ratio.

18. The memory device of claim 17, wherein the coupling ratio is between about 0.1 and about 0.2.

19. The memory device of claim 15, wherein:
the high voltage level is about 1.5 times the first voltage level; and
the low voltage level is between about 0.4 times the first voltage level and about 0.6 times the first voltage level.

20. The memory device of claim 15, wherein the dedicated time is about 2 µs.

* * * * *